(12) United States Patent
van 't Erve et al.

(10) Patent No.: US 11,605,410 B2
(45) Date of Patent: Mar. 14, 2023

(54) MULTISTATE MAGNETIC MEMORY ELEMENT USING METAMAGNETIC MATERIALS

(71) Applicant: The Government of the United States of America, as represented by the Secretary of the Navy, Arlington, VA (US)

(72) Inventors: Olaf M. J. van 't Erve, Falls Church, VA (US); Steven P. Bennett, Alexandria, VA (US); Adam L. Friedman, Silver Spring, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 113 days.

(21) Appl. No.: 17/362,355

(22) Filed: Jun. 29, 2021

(65) Prior Publication Data

US 2021/0327486 A1    Oct. 21, 2021

Related U.S. Application Data

(62) Division of application No. 16/383,590, filed on Apr. 13, 2019, now Pat. No. 11,074,950.

(60) Provisional application No. 62/662,967, filed on Apr. 26, 2018.

(51) Int. Cl.
*H01L 43/12* (2006.01)
*G11C 11/16* (2006.01)
*H01L 43/10* (2006.01)
*G11C 11/56* (2006.01)
*H01L 43/08* (2006.01)

(52) U.S. Cl.
CPC ........ *G11C 11/161* (2013.01); *G11C 11/5607* (2013.01); *H01L 43/08* (2013.01); *H01L 43/10* (2013.01); *H01L 43/12* (2013.01)

(58) Field of Classification Search
CPC ....... G11C 11/161; G11C 11/15; G11C 11/16; G11C 11/5607; H01L 43/12; H01L 43/08; H01L 43/10; B82Y 25/00
See application file for complete search history.

(56) References Cited

U.S. PATENT DOCUMENTS

2014/0153324 A1\* 6/2014 Yu .......................... H01L 43/08
                                                        365/158

\* cited by examiner

*Primary Examiner* — Selim U Ahmed
(74) *Attorney, Agent, or Firm* — US Naval Research Laboratory; Stephen T. Hunnius

(57) ABSTRACT

A metamagnetic tunneling-based spin valve device for multistate magnetic memory comprising an electronic memory logic element with four stable resistance states. A metamagnetic tunneling-based spin valve device for multistate magnetic memory comprising a layer of a metamagnetic material, a layer of a nonmagnetic material on the layer of a metamagnetic material, and a layer of a ferromagnetic material on the layer of a nonmagnetic material. A method of making a metamagnetic tunneling-based spin valve device for multistate magnetic memory.

13 Claims, 6 Drawing Sheets

MULTISTATE MAGNETIC MEMORY ELEMENT USING METAMAGNETIC MATERIALS

REFERENCE TO RELATED APPLICATION

This application is a non-provisional of, and claims priority to and the benefits of, U.S. Application No. 62/662,967 filed on Apr. 26, 2018 and U.S. Patent Application No. 16/383,590 filed on Apr. 13, 2019, the entirety of each is hereby incorporated by reference.

BACKGROUND

This invention disclosure describes and demonstrates a process that uses thin films of metamagnetic materials, such as FeRh alloys, in magnetic multilayers for memory purposes.

This invention disclosure describes and demonstrates a method for stabilizing the resistance of the multilayer in any of four unique and discernable states by magnetic field and operational temperature control.

This invention disclosure describes and demonstrates a method using a metamagnetic/magnetic metallic multilayer for low-resistance, high-speed applications.

This invention disclosure describes and demonstrates a method that incorporates insulating tunnel barriers between a metamagnetic and magnetic layer for increased switching sensitivity via a large tunneling magnetoresistance response.

Magnetic random-access memory (MRAM) is a promising technology with the potential to take over a large segment of the memory market currently served by electronic charge-based devices. The appeal of magnetic-based memory is the built-in non-volatility of the memory state using the magnetization of a magnetic layer. Furthermore, magnetic memory is considered to have an unlimited amount of memory cycles, is scalable, and is fast.

All of these features are recognized by industry as promising metrics to meet the growing need for memory solutions in the future. Even though MRAM is available, the field is still in its infancy.

The current state of the art magnetic memory element is comprised of ferromagnetic layers separated by an insulator such as MgO. There are only two available stable states—the parallel or antiparallel alignment of the two ferromagnetic layers.

Alternatively, one can use the anisotropic magnetoresistance effect of a single metamagnetic layer such as FeRh. However, the AMR effect reported in literature is ~0.2% and has a theoretical maximum of ~1.5%. Charge-based devices for memory purposes are either fast and volatile (SRAM) or slow and non-volatile with limited repeatability ("Flash memory"). Other alternative memories, such as, resistance-based phase change materials only have two stable states (e.g. amorphous vs crystalline Ge) or ion movement in memristors.

Films of iron rhodium (FeRh) are known to exhibit a unique antiferromagnetic (AF) to ferromagnetic (FM) transition slightly above room temperature, known as the metamagnetic phase transition.

FeRh is a unique material that changes its intrinsic magnetic order at an ambient temperature range of 280 K to 360 K. This highly unusual metamagnetic transition offers the possibility to switch between the two magnetic phases by external perturbation, such as temperature, offering completely new avenues for magnetism-based device design.

SUMMARY OF DISCLOSURE

Description

This invention describes and demonstrates a process that uses thin films of metamagnetic materials, such as FeRh alloys, in magnetic multilayers for memory purposes.

This invention describes and demonstrates a method for stabilizing the resistance of the multilayer in any of four unique and discernable states by magnetic field and operational temperature control.

This invention describes and demonstrates a method using a metamagnetic/magnetic metallic multilayer for low-resistance, high-speed applications.

This invention describes and demonstrates a method that incorporates insulating tunnel barriers between a metamagnetic and a magnetic layer for increased switching sensitivity via a large tunneling magnetoresistance response.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This invention disclosure describes and demonstrates a process that uses thin films of metamagnetic materials, such as FeRh alloys, in magnetic multilayers for memory purposes.

This invention disclosure describes and demonstrates a method for stabilizing the resistance of the multilayer in any of four unique and discernable states by magnetic field and operational temperature control.

This invention disclosure describes and demonstrates a method using a metamagnetic/magnetic metallic multilayer for low-resistance, high-speed applications.

This invention disclosure describes and demonstrates a method that incorporates insulating tunnel barriers between a metamagnetic and magnetic layer for increased switching sensitivity via a large tunneling magnetoresistance response.

Figure 1:
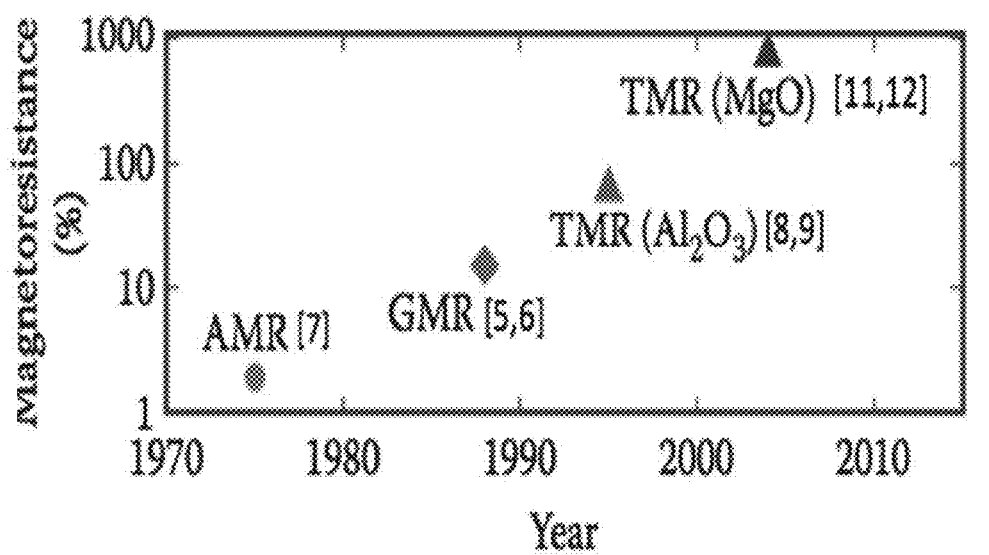
FIG. 1 illustrates a timeline of magnetoresistance devices. A GMR device from Fe/Cr/Fe multilayer. Fe layers are parallel, one spin species experiences weak scattering only in both magnetic layers and a low overall resistance is measured. Fe layers are anti parallel, both spin species experience strong scattering and a high resistance is measured.
Figure 1:
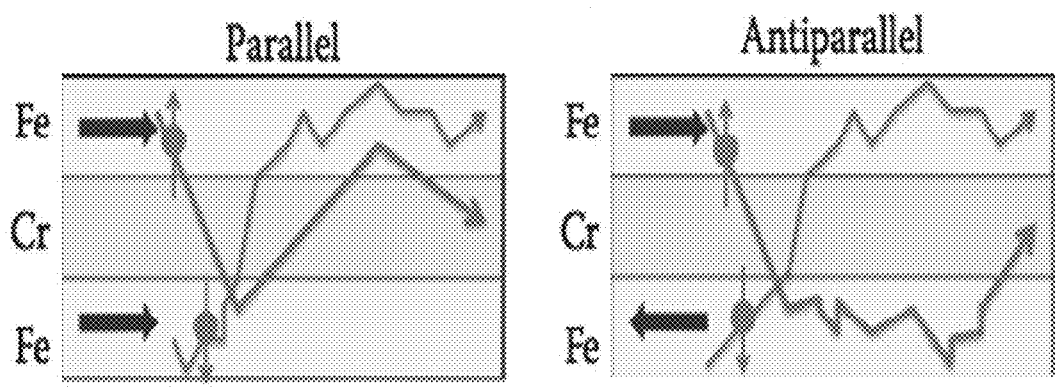

One of the first successful commercial transitions in spintronics was based on the giant magnetoresistance (GMR) effect, shown in FIG. 1, discovered in 1988. A nonmagnetic metal layer separates two magnetic layers. Electrons are naturally spin-polarized in a ferromagnet (FM) due to its spin-polarized density of states. Majority spin electrons can have their moment (spin) aligned parallel or antiparallel to the magnetization of the FM. These electrons experience weak scattering during transport within the FM. Minority spin electrons have their moment (spin) aligned either anti-parallel or parallel to the magnetization and experience stronger scattering in the FM.

EXAMPLE 1

If the magnetizations of the two magnetic layers are parallel, as depicted in FIG. 1, then the majority spin electrons of the top layer will enter the bottom layer as majority spin and the overall resistance is low. When the two layer magnetizations are aligned anti-parallel, as depicted in FIG. 1, the majority spins of the top layer will be minority spins in the bottom layer, and the overall stack resistance will be higher.

Resistance changes on the order of 10% were obtained with these structures, which was far better than the best anisotropic magnetoresistance (AMR) devices that were used as the read-heads to detect the small changes in magnetic field lines on the magnetic platter of a hard disk at the time.

EXAMPLE 2

Later work replaced the metallic interlayer of the GMR stack by a thin insulator. Transport across this thin insulator is possible by tunneling, a purely quantum mechanics-based effect. Tunneling across a thin insulator depends critically on the density of states (DOS) available on both sides of the tunnel barrier.

Figure 2:
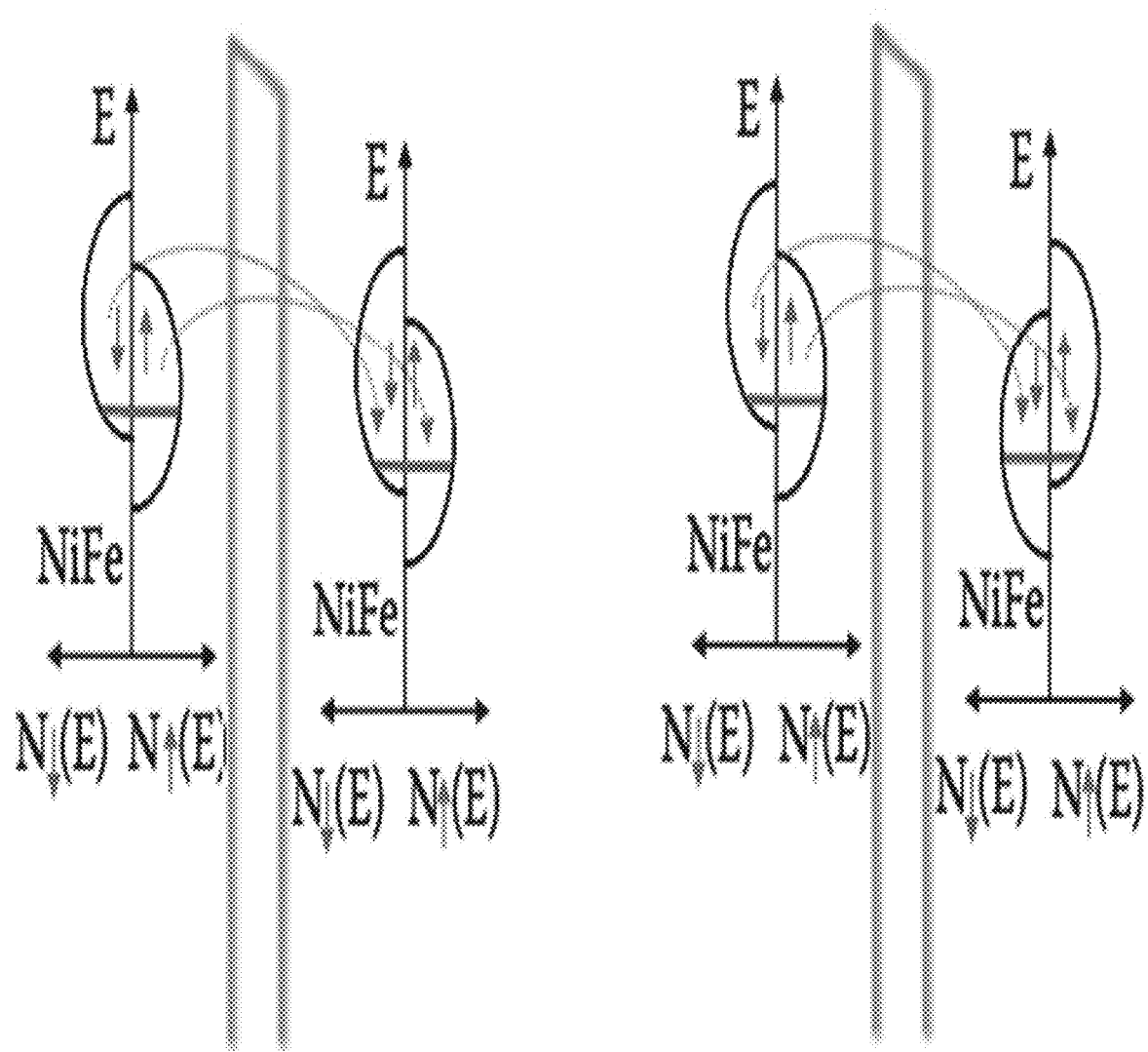
FIG. 2 illustrates a simplified diagram of tunneling from ferromagnet to ferromagnet. Magnetization is parallel. One spin species tunnels from a large density of states to a large density of states, and a low tunnel resistance is measured. Magnetizations antiparallel, both spin species tunnel from a large (small) density of states to a small (large) density of states, and a high tunnel resistance is measured.

Since the DOS at the FM/insulator interface is spin dependent, the tunnel process becomes spin dependent. When the magnetic layers are aligned with their magnetizations parallel, majority electrons that have a large DOS in the left electrode, as in FIG. 2, can readily tunnel to the large DOS of the majority state of the right electrode. However, when the magnetic electrodes have their magnetizations anti-parallel, the majority electrons with a large DOS can only tunnel to the minority states of the right electrode, which has a much smaller DOS.

Thus, the tunnel resistance is increased by this spin-dependent effect. Tunnel magnetoresistance effects of over 200% have been observed in Fe/MgO/Fe tunnel barriers. These barriers are now the major component in read-heads for hard disks and they are the memory elements of choice in currently available MRAM.

Figure 3:
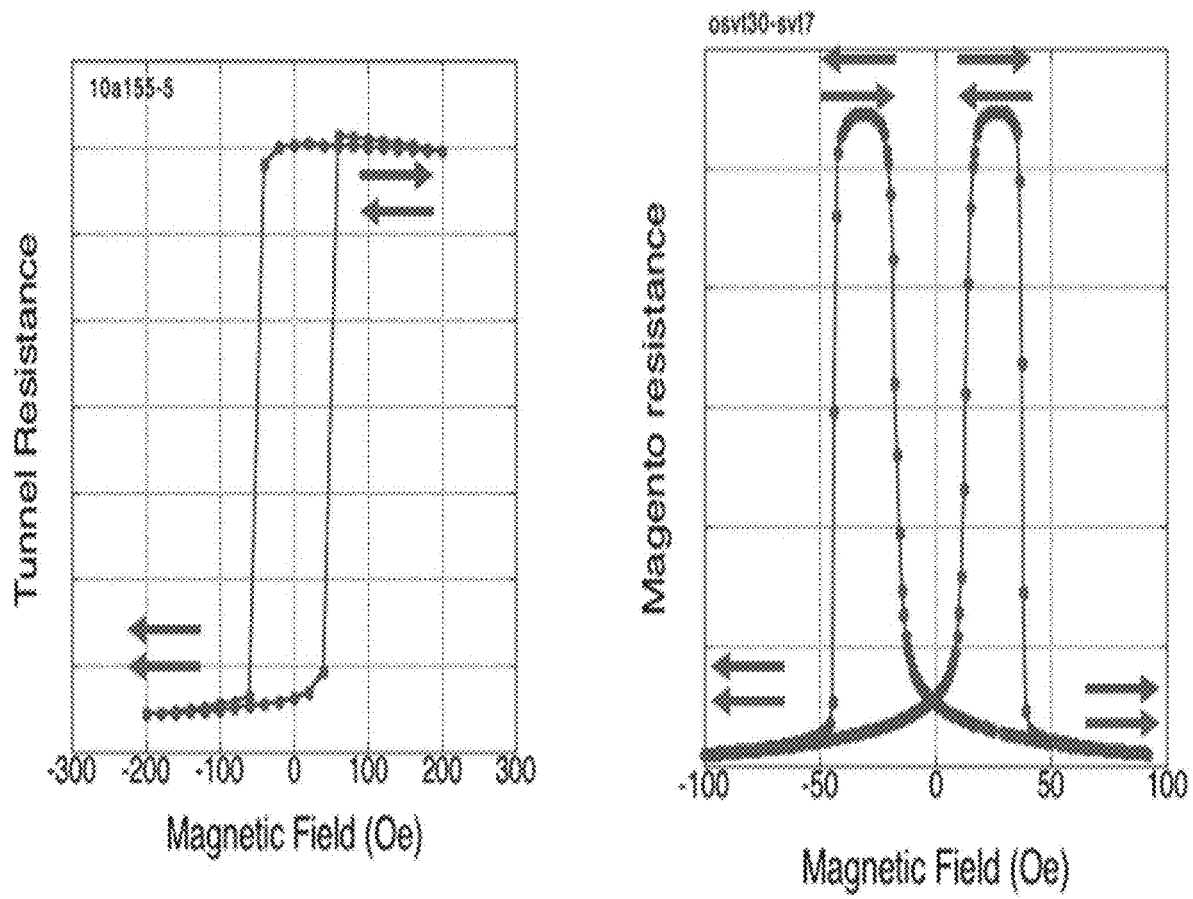
FIG. 3 illustrates a graph of resistance vs. magnetic field of a MTJ, minor loop is shown. Also illustrated is resistance vs. magnetic field of a metallic pseudo spin valve, major loop is shown. Arrows indicate magnetization direction of top and bottom layer.

As discussed above, a magnetic tunnel junction and metallic spin valve have two states, parallel and anti-parallel, with two significantly different resistances, as shown in FIG. 3. When this property is used to build MRAM, this memory is non-volatile, since the parallel and the anti-parallel states are stable states.

Films of iron rhodium (FeRh) have long been known to exhibit a unique antiferromagnetic (AFM) to ferromagnetic (FM) transition slightly above room temperature, the metamagnetic phase transition. FeRh is a unique material that changes its intrinsic magnetic order at an ambient temperature of 360 K. This highly unusual metamagnetic transition offers a possibility to switch between the two magnetic phases by external perturbation.

EXAMPLE 3

Figure 4:
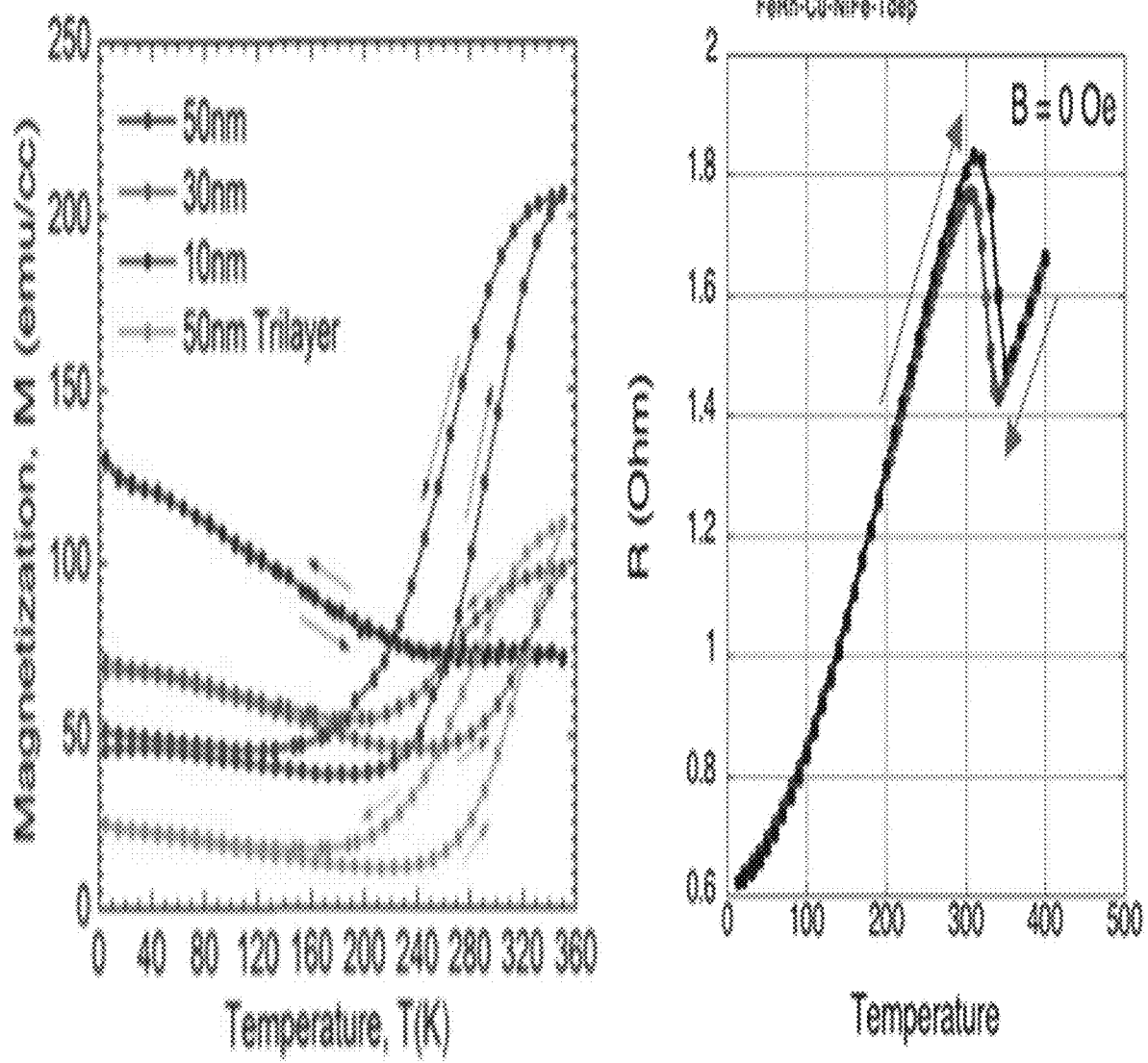
FIG. 4 illustrates saturation magnetization curves as a function of temperature for FeRh(Pd) single layer films with 1 T applied field grown at 600° C. with varying thicknesses: 50 nm, 30 nm and 10 nm. Also illustrated is the 4-point resistance of NRL grown FeRh film vs. Temperature. Arrows indicate the temperature sweep direction.

FIG. 4 demonstrates the drastic change in magnetization (M) when an FeRh film is driven from its AFM phase to FM phase and back by temperature cycling of the sample.

The magnetic phase exhibits hysteresis while temperature cycling the sample, as it takes more energy to change back from one phase to the other.

This magnetic phase change is also seen in the temperature dependence of the resistance, since the spin dependent scattering in the AFM phase is higher than it is in the FM phase. FIG. 4 shows the temperature dependent resistance of a NRL grown FeRh film, where a similar hysteresis is observed as in the magnetization versus temperature curve.

EXAMPLE 4

Fabrication of FeRh Tunneling-based Spin Valve Device is described.

We demonstrated the fabrication of devices with one of the ferromagnetic layers of a magnetic tunneling junction (MTJ) or a metallic spin valve replaced by a metamagnetic layer, such as FeRh.

In order to demonstrate the principle function of this device, we fabricated the following multilayers, 30 nm FeRh/5 nm Cu/30 nm NiFe on MgO and 30 nm FeRh/5 nm Cu/30 nm NiFe on sapphire.

These films were grown by sputter deposition. The FeRh with thickness 30 nm was grown at 600° C. Then, to minimize interdiffusion, the structure was allowed to cool down to room temperature before the 5 nm Cu and 30 nm NiFe layers were sputtered.

EXAMPLE 5

We demonstrated the operation of the above fabricated device in three distinct temperature regimes comprising four distinct operational regimes.

First, at "cold" temperatures, as defined as being below the phase transition (for this sample <360K), FeRh film is in its AFM phase and no spin-valve effect is expected to be measured, as shown in the bottom curve in FIG. 5.

The only observable magnetoresistance effect is the anisotropic magnetoresistance at the coercive fields of the NiFe film.

Figure 5:
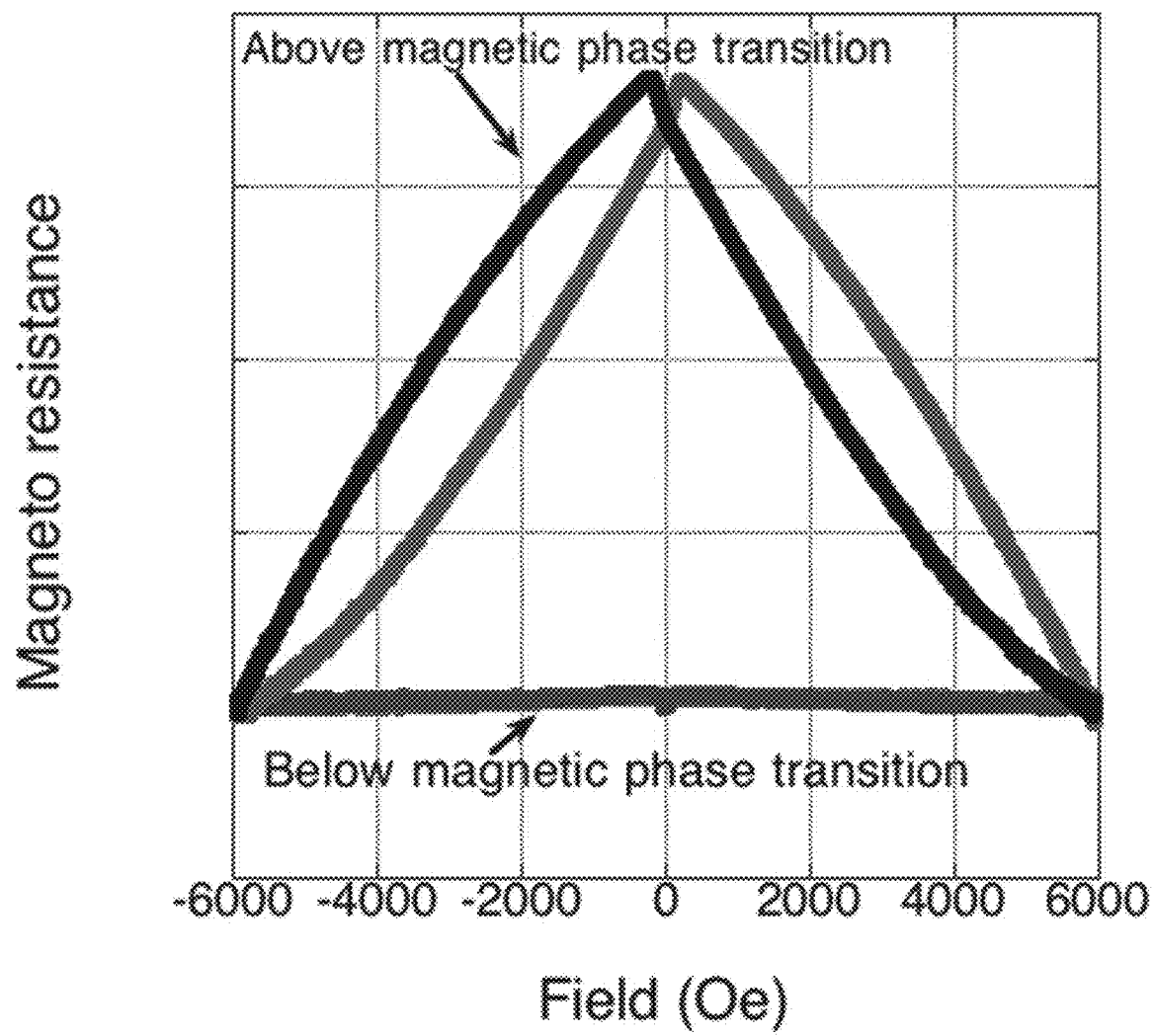
FIG. 5 illustrates magnetoresistance curves above and below the phase transition.

Second, at "warm" temperatures, as defined as being above the phase transition (for this sample >360K), FeRh is in its FM phase and the device is expected to work as a traditional spin valve device, as shown in the top curve of FIG. 5.

EXAMPLE 6

A distinct regime was observed when the device was operated at a fixed temperature in the hysteretic part of the magnetic phase change.

Here, the device operated as a spin-valve device in two different resistance regimes (giving the third and fourth operational regimes) that can be accessed by either cooling through the magnetic phase change or heating up through the phase change.

Figure 6:
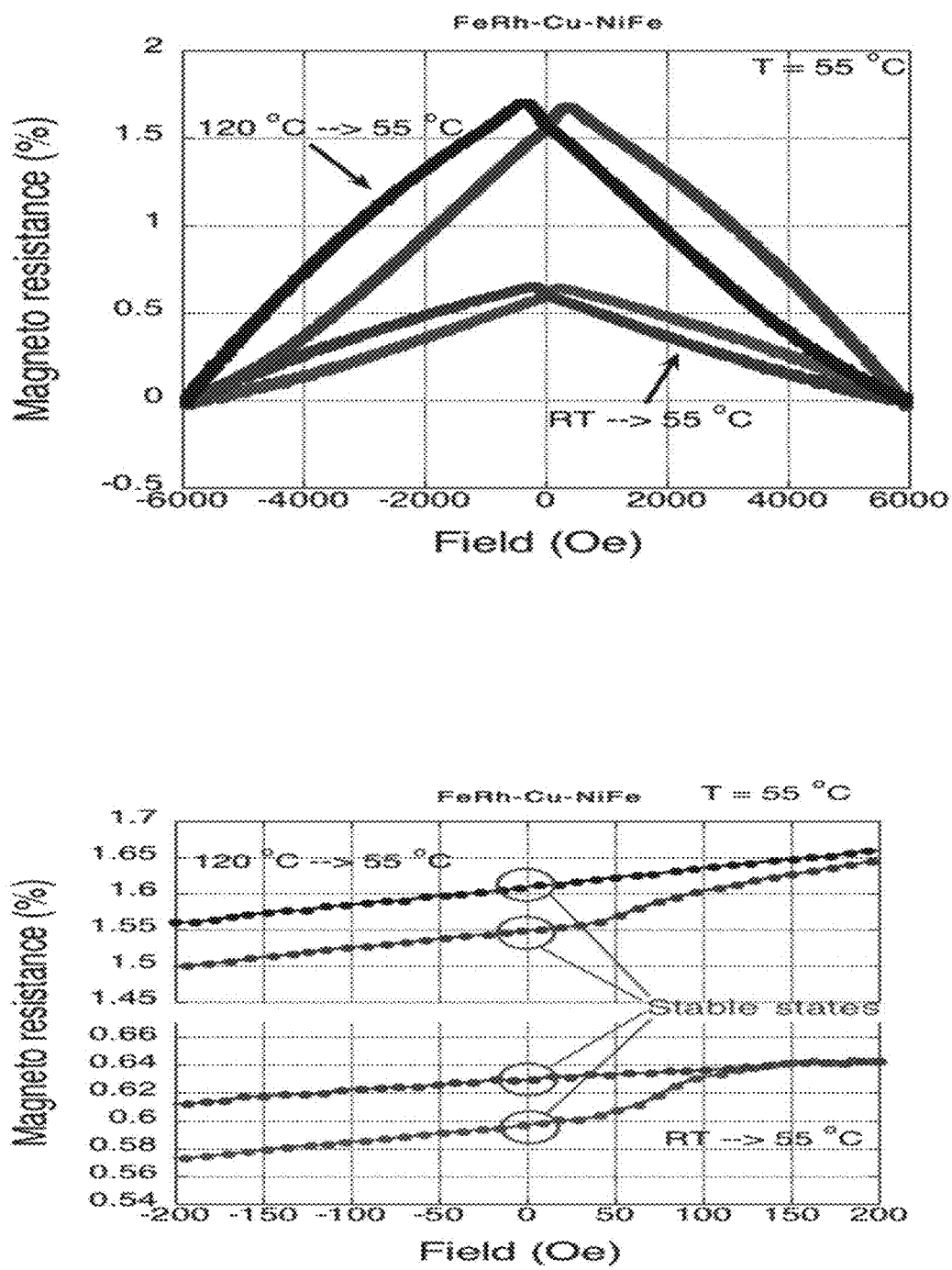
FIG. 6 illustrates major and minor loops at a fixed temperature, showing four stable resistance states, or operational regimes, of the device at a fixed temperature.

This is evident in FIG. 6. FIG. 6 shows the major magnetoresistance "loops" at a fixed temperature and FIG. 6 shows the minor "loops." Here the term "loops" refers to a complete cycling of the magnetic field.

EXAMPLE 7

FIG. 6 shows the four stable resistance states at a fixed temperature and zero magnetic field that can all be individually addressed by changing two physical quantities, magnetic field and temperature.

The device shown in FIG. 6 is a metallic spin valve with ~1.5% magnitude change in magnetoresistance above the zero-field value, hereafter referred to as "MR." Metallic spin valves have been shown with effects of up to ~10% MR and the magnetic behavior can be tuned with the spacer thickness and composition and the FM layer thickness and composition.

EXAMPLE 8

The metallic spacer layer can be replaced with an insulating tunnel barrier in our demonstrated device to make an MTJ, which is easily achievable after our demonstration above. MTJs can have magnetoresistance effects of ~200% MR for certain combinations of FMs and insulators.

The device shown in FIG. 6 uses FeRh as the metamagnetic layer and temperature to drive the magnetic phase change. Laser heating and cooling can be used to drive the magnetic phase change and external magnetic fields can set the magnetization of the FM layer.

Our multistate magnetic memory element using metamagnetic materials has many advantages.

For example, the magnetic device can be switched on and off by operating it below or above the phase change. No other currently envisioned or marketed magnetic-based devices use this approach, nor can they do this.

Four stable resistance states can be obtained at a fixed temperature and zero magnetic field that can all be individually addressed by changing two physical quantities: magnetic field and/or temperature. This is superior to the current magnetic-based, charge-based or structural phase-change memory devices which only have two stable states.

Further, our device can be an ad-hoc or "drop-in" replacement as magnetic memory element allowing 2 bits of information per memory element. No other similar device technology exists that is capable of this performance.

Additionally, our device can be used as a single failsafe electronic switch that needs two physical properties (temperature and magnetic field) to switch its electronic state, thus adding an extra fail mechanism over electronic switches that require only one physical property to change state, such as charge (transistor), magnetic field (magnetic tunnel junction), temperature (phase change element), or Ion movement (memristor).

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of making a metamagnetic tunneling-based spin valve device for multistate magnetic memory comprising the steps of:
    providing a substrate;
    fabricating a layer of a metamagnetic material on the substrate;
    fabricating a layer of a nonmagnetic material on the layer of a metamagnetic material;
    fabricating a layer of a ferromagnetic material on the layer of a nonmagnetic material;
    forming an electronic memory logic element with four stable resistance states;
    wherein the electronic memory logic element with four stable resistance states comprises states which depend on two physical domains;
    wherein the two physical domains comprise temperature sweep direction and magnetic field;
    wherein the electronic memory logic element with four stable resistance states comprises FeRh;
    undergoing a magnetic phase change of the FeRh with temperature cycling and comprises an associated hysteresis; and
    obtaining the 4 stable resistance states at a fixed temperature and zero magnetic field.

2. The method of making a metamagnetic tunneling-based spin valve device for multistate magnetic memory of claim 1
    wherein the layer of a metamagnetic material comprises FeRh.

3. The method of making a metamagnetic tunneling-based spin valve device for multistate magnetic memory of claim 2
    wherein the layer of a ferromagnetic material comprises NiFe.

4. The method of making a metamagnetic tunneling-based spin valve device for multistate magnetic memory of claim 3
    wherein layer of a nonmagnetic material comprises a nonmagnetic metal.

5. The method of making a metamagnetic tunneling-based spin valve device for multistate magnetic memory of claim 4
    wherein the nonmagnetic metal comprises copper.

6. The method of making a metamagnetic tunneling-based spin valve device for multistate magnetic memory of claim 1 wherein the step of fabricating a layer of a metamagnetic material on the substrate comprises the step of sputtering or depositing by sputter deposition the layer of a metamagnetic material on the substrate.

7. The method of making a metamagnetic tunneling-based spin valve device for multistate magnetic memory of claim 6
wherein the step of sputtering or depositing by sputter deposition the layer of a metamagnetic material on the substrate comprises sputtering a layer of FeRh.

8. The method of making a metamagnetic tunneling-based spin valve device for multistate magnetic memory of claim 7
wherein the layer of FeRh is 30 nm thick.

9. The method of making a metamagnetic tunneling-based spin valve device for multistate magnetic memory of claim 8
wherein the step of sputtering or depositing by sputter deposition the layer of FeRh occurs at a temperature of 600° C.; and
further comprising the step of
cooling the layer of FeRh to room temperature;
wherein the step of fabricating a layer of a nonmagnetic material on the layer of a metamagnetic material comprises fabricating a layer of Cu; and
wherein the step of fabricating a layer of a ferromagnetic material on the layer of a nonmagnetic material comprises fabricating a layer of NiFe.

10. The method of making a metamagnetic tunneling-based spin valve device for multistate magnetic memory of claim 1
including a MgO substrate or a sapphire substrate.

11. The method of making a metamagnetic tunneling-based spin valve device for multistate magnetic memory of claim 1
wherein the electronic memory logic element with four stable resistance states comprises two magnetic layers and wherein the two magnetic layers are separated by a nonmagnetic layer.

12. The method of making a metamagnetic tunneling-based spin valve device for multistate magnetic memory of claim 1
wherein one of the magnetic layers comprises FeRh; and
wherein the nonmagnetic layer comprises a metal or a tunnel-barrier.

13. The method of making a metamagnetic tunneling-based spin valve device for multistate magnetic memory of claim 1
wherein the four stable resistance states are individually addressable with temperature cycling and magnetic field cycling;
wherein the resistance depends on the relative magnetization of magnetic layers; and
wherein the metamagnetic tunneling-based spin valve device for multistate magnetic memory is used for nonvolatile electronics.

* * * * *